(12) United States Patent
Kiehne et al.

(10) Patent No.: US 9,206,295 B2
(45) Date of Patent: Dec. 8, 2015

(54) WHITE COATED POLYESTER FILM, PROCESS FOR PRODUCTION THEREOF AND USE THEREOF AS A BACKSIDE COVER IN SOLAR MODULES

(75) Inventors: Thorsten Kiehne, Shiga (JP); Masato Fujita, Shiga (JP)

(73) Assignee: Mitsubishi Polyester Film GmbH, Wiesbaden (DE)

( * ) Notice: Subject to any disclaimer, the term of this patent is extended or adjusted under 35 U.S.C. 154(b) by 588 days.

(21) Appl. No.: 12/384,294

(22) Filed: Apr. 2, 2009

(65) Prior Publication Data

US 2010/0215902 A1    Aug. 26, 2010

(30) Foreign Application Priority Data

Feb. 20, 2009  (DE) .................. 10 2009 009 791

(51) Int. Cl.
| | | |
|---|---|---|
| *B32B 7/02* | (2006.01) | |
| *B32B 27/40* | (2006.01) | |
| *B32B 27/36* | (2006.01) | |
| *C08J 7/04* | (2006.01) | |
| *C09J 133/14* | (2006.01) | |
| *C09J 175/04* | (2006.01) | |
| *B32B 17/10* | (2006.01) | |
| *H01L 31/048* | (2014.01) | |

(52) U.S. Cl.
CPC ........... *C08J 7/047* (2013.01); *B32B 17/10018* (2013.01); *B32B 17/10788* (2013.01); *C09J 133/14* (2013.01); *C09J 175/04* (2013.01); *B32B 2367/00* (2013.01); *C08J 2367/02* (2013.01); *C08J 2475/00* (2013.01); *H01L 31/048* (2013.01); *Y10T 428/24355* (2015.01); *Y10T 428/265* (2015.01); *Y10T 428/31507* (2015.04); *Y10T 428/31565* (2015.04)

(58) Field of Classification Search
CPC ................... B32B 17/10018; B32B 17/10788; B32B 27/40; C08J 7/047
See application file for complete search history.

(56) References Cited

U.S. PATENT DOCUMENTS

| | | | | |
|---|---|---|---|---|
| 4,755,337 | A | * 7/1988 | Takahashi et al. ............ | 264/134 |
| 6,348,267 | B1 | * 2/2002 | Okajima .................... | 428/423.7 |
| 2009/0286925 | A1 | * 11/2009 | Okamatsu et al. ........... | 524/591 |
| 2011/0306747 | A1 | * 12/2011 | Hashimoto et al. ............ | 528/83 |

FOREIGN PATENT DOCUMENTS

| | | | |
|---|---|---|---|
| EP | 1 826 826 | A1 | 8/2007 |
| EP | 1 908 587 | A1 | 4/2008 |
| JP | H08-169096 | A | 7/1996 |
| JP | H11-179836 | A1 | 7/1999 |
| JP | 2000-355086 | A | 12/2000 |
| JP | 2002-338718 | A | 11/2002 |
| JP | 2008-004691 | A1 | 6/2006 |
| JP | 2006-175764 | A | 7/2006 |
| JP | 2007048944 | A * | 2/2007 |
| JP | 2008-004691 | A * | 1/2008 |
| WO | WO2008/032830 | A1 * | 3/2008 |

OTHER PUBLICATIONS

Machine translation of JP2008-004691. Retrieved Sep. 30, 2011.*
"2-Isopropenyl-2-oxazoline" Sigma-Aldrich, pp. 1-3. Retrieved Sep. 29, 2011.*
"Carbodiimides (EDAC) Heterobifunctional cross-linkers". Uptima, pp. 1-5. Retrieved Sep. 30, 2011.*
"A Guide to Silane Solutions from Dow Corning". Dow Corning, (2005); pp. 3-31.*
"ThreeBond Technical News: Introduction to Adhesion Science (Part 2)". ThreeBond Co., Ltd., (1983); pp. 1-10.*
Machine translation of JP2007-048944. Retrieved Jan. 21, 2015.*

* cited by examiner

*Primary Examiner* — Prashant J Khatri
(74) *Attorney, Agent, or Firm* — ProPat, L.L.C.

(57) ABSTRACT

A white coated polyester film is provided which has excellent adhesion to the ethylene-vinyl acetate (EVA) typically used as an encapsulation material in solar modules. The good adhesion properties are achieved with a polymeric coating which includes at least one polyurethane and a crosslinker.

14 Claims, No Drawings

WHITE COATED POLYESTER FILM, PROCESS FOR PRODUCTION THEREOF AND USE THEREOF AS A BACKSIDE COVER IN SOLAR MODULES

CROSS-REFERENCE TO RELATED APPLICATIONS

This application claims priority to German Patent Application 10 2009 009 791.0 filed Feb. 20, 2009 which is hereby incorporated herein by reference in its entirety.

FIELD OF THE INVENTION

The invention relates to a white coated polyester film which has excellent adhesion to ethylene-vinyl acetate (EVA) which is typically used as an encapsulation material in solar modules. The good adhesion properties are achieved with a polymeric coating which comprises at least one polyurethane and a crosslinker.

BACKGROUND OF THE INVENTION

Solar modules serve for direct conversion of sunlight to electrical energy. As the most important constituent, they contain groups of solar cells which are connected electrically to one another in a suitable manner within the solar module and are embedded in different materials. These arrangements fulfil the following purposes, among others:
  transparent, radiation- and weathering-resistant coverage of the solar cells,
  protection of the brittle solar cell from mechanical influences,
  protection of the solar cells and of the electrical connections from moisture:
  protection from contact with the electrical components.
Typically, solar modules consist of:
a transparent front cover, which is usually glass;
a transparent polymer material in which the solar cells are embedded;
  the most frequently used material is ethylene-vinyl acetate (EVA) in the form of films, which melts at relatively high temperature, is crosslinked by means of suitable additives and is thus extremely resistant to outside influences. According to the EVA type and the additives present therein, the crosslinking process requires a different amount of time. A distinction is drawn between so-called "standard cure" and "fast cure" types.
a backside cover which may in principle be transparent or colored.
  Typically, polymer films or laminates of polymer films (e.g. of fluoropolymer and polyester films) are used. White nontransparent backside covers offer the advantage that light which falls between the solar cells is reflected from the upper side of the backside cover, which increases the efficiency of the solar modules.

In the production process of solar modules, front cover, EVA with solar cells and backside cover are bonded to one another in a vacuum laminator at temperatures of appox. 150° C. In order to achieve the required long lifetimes of solar modules of 20 to 40 years, it is necessary to ensure excellent durable adhesion of the front and backside covers to the EVA embedding material.

It would be desirable to have a white nontransparent polyester film with an EVA adhesion coating, which has excellent long-term stability to humidity and elevated temperature and is suitable for use as a backside cover in solar modules. The coating should have a good mechanical in order to withstand without damage the stresses which occur in the film production process, the winding and unwinding of the film and in the production of the solar modules. In order to meet the requirement for less expensive availability of solar power, the polyester film should also be producible in an economically viable manner; however, such white coated films are unknown to date.

EP-A-1 826 826 (whose United States equivalent is U.S. Patent Application Publication No. 2008/0050583A1) describes a polyester film provided with an EVA adhesion coating. The base film may also be colored white, black or another color; in the examples, however, only transparent films were used. The coating comprises a crosslinker and a polymer selected from the group of polyesters with a glass transition temperature of 20 to 100° C., acrylates with a glass transition temperature of 20 to 100° C., combinations of these polyesters and acrylates, and combinations of these polyesters and/or acrylates with polyvinyl alcohol having a degree of hydrolysis of 70 to 90 mol %. The crosslinkers used may, according to the publication, be urea or epoxy compounds, melamine or polymers containing oxazoline groups, the latter being described as particularly suitable. Owing to the known hydrolysis sensitivity of ester groups, polyester-based coatings, however, do not appear to be very suitable to ensure a good adhesion to EVA over a long period at high temperature and humidity. Polyvinyl alcohol tends to degrade and discolor even at elevated temperature in the production process of polyester films or under stress through light and heat in the solar module. The film claimed therefore hardly appears to be suitable for use as a durable backside cover in solar modules.

EP-A-1 908 587 (whose United States equivalent is U.S. Patent Application Publication No. 2009/0034235A1) claims a multilayer white film with good reflection properties for visible light, which is described as stable to discoloration under the influence of UV light. The good reflection properties for visible light are achieved by modification of a layer of the film with 31 to 60% by weight, and of a further layer with 0 to 30% by weight, of inert particles. According to the publication, barium sulfate is particularly suitable for this purpose. Another raw material used in addition to polyethylene terephthalate is polyethylene naphthalate. The film is said to be suitable primarily as a reflector in liquid crystal displays, but a possible use of the films for backside coverage in solar modules is also mentioned. Since, given such a high proportion of inert particles, tears in the film are barely avoidable in the production process, it is, however, doubtful whether such a film can still be produced with economically acceptable costs for solar applications too. Moreover, the publication does not mention how good adhesion to EVA at high temperature and humidity over a long period is ensured in the case of application in solar modules.

SUMMARY OF ADVANTAGEOUS EMBODIMENTS OF THE INVENTION

It was an object of the present invention to provide a white nontransparent polyester film with a durable, extremely resistant EVA adhesion coating, which, either alone or in a composite with other materials, is suitable as a backside cover in solar modules.

The film is notable, among other features, for low transparency, high whiteness, high gloss, low shrinkage, very good adhesion values to EVA, even at elevated temperature and humidity, and mechanical resistance of the coating. Moreover, the film also maintains a low yellowness index when its own regrind is used.

DETAILED DESCRIPTION OF ADVANTAGEOUS EMBODIMENTS OF THE INVENTION

The object is achieved in accordance with the invention by the provision of a white nontransparent coated polyester film, the coating comprising at least the following components:
1.) a polyurethane,
2.) a crosslinker.

A low transparency of the coated polyester film means that the transparency is <40%, preferably <35% and more preferably <30%.

A high whiteness means that the coated polyester film has a Berger whiteness of >70, preferably >75 and more preferably >80.

A high gloss means that the gloss of the coated polyester film, measured at a measurement angle of 20°, is >5, preferably >10 and more preferably >20.

A low shrinkage means that the coated polyester film shrinks less than 2.5%, preferably less than 2.0% and more preferably less than 1.5% at 150° C. within 15 min in machine direction and transverse direction.

Very good adhesion values to EVA mean that the force required to separate a laminate composed of the film coated in accordance with the invention and EVA at an angle of 180° is >50 N/15 mm, preferably >70 N/15 mm.

An excellent long-term stability of the EVA adhesion coating to elevated temperature and humidity means that the force required to separate a laminate composed of the inventive coated film and EVA, after storage at 85° C./85% rel. air humidity over a period of 1000 h, is still at least 50% of the starting value.

A good mechanical resistance of the coating means that the hardness of the coating, measured by means of nanoindentation, is >0.2 GPa, preferably >0.25 GPa and more preferably >0.3 GPa.

The polyester film is suitable as a backside cover in solar modules when a laminate consisting of glass, EVA and the film withstands accelerated weathering in a Xenon weathering instrument to ISO4892 over a period of 20 000 h (comparable to about 20 years of outside use under central European climatic conditions) without delamination. The SV value of the base film after production is more than 700, preferably more than 650, in order still to have sufficient mechanical strength even after prolonged use as a backside cover in solar modules.

For good winding and processing performance of the film, the mean roughness $R_a$ of the film should be >20, preferably >25 and more preferably >30 nm. Moreover, the wound coated film must not stick to adjacent film layers at relatively high temperature and air humidity, since this complicates or even makes impossible further processing of the film. This property is referred to hereinafter as "film blocking" and is described by the force needed to separate film layers from one another after storage under defined climatic conditions. In the case of the film coated in accordance with the invention, forces of less than 50 g are needed for this purpose after 20 h at 40° C./80% rel. air humidity.

A low yellowness index in spite of use of its own regrind means that the yellowness index of the polyester film in the case of use of up to 50% regrind which has been produced from the film coated in accordance with the invention is less than 80, preferably less than 70.

Description of the Inventive EVA Adhesion Coating

The inventive white nontransparent polyester film bears, on at least one side, an EVA adhesion coating which comprises at least the following components:
1.) a polyurethane,
2.) a crosslinker.

Polyurethanes and crosslinkers suitable in accordance with the invention are described in detail hereinafter.

Aqueous polyurethane dispersions which are suitable for use in the inventive coating formulation can be prepared by reaction of polyhydroxyl compounds (also referred to hereinafter as "polyol") and polyisocyanates. Examples of polyhydroxyl compounds are polyesterpolyols, polycarbonatepolyols and polyoxyalkylenepolyols.

Polyester polyols are understood to mean those compounds which form through polycondensation of at least one low molecular weight diol selected from the group of ethylene glycol, diethylene glycol, triethylene glycol, 1,2-propylene glycol, 1,3-butylene glycol, 1,5-pentanediol, 1,4-butylene glycol, 1,6-hexanediol, dipropylene glycol, tripropylene glycol, neopentyl glycol, cyclohexanediol and cyclohexanedimethanol with at least one polycarboxylic acid, for example malonic acid, maleic acid, succinic acid, adipic acid, azelaic acid, tartaric acid, pimelic acid, sebacic acid, oxalic acid, terephthalic acid, isophthalic acid, fumaric acid, dimer acid, trimellitic acid or derivatives of the polycarboxylic acids mentioned, or else those which are preparable by ring-opening polymerization of cyclic compounds, such as eta-caprolactam.

Polycarbonatepolyols are compounds which form through reaction of at least one diol, for example ethylene glycol, propylene glycol, 1,3-propanediol, 1,4-butanediol, 1,5-pentanediol, 1,6-hexanediol, 1,9-nonanediol, 1,8-nonanediol, neopentyl glycol, diethylene glycol, dipropylene glycol, 1,4-cyclohexane-diol or bisphenol A, with at least one carbonate, for example dimethyl carbonate, diphenyl carbonate, ethylene carbonate or phosgene.

Polyoxyalkylenepolyols form, among other routes, through ring-opening polymerization of at least one cyclic ether, for example oxetane, tetrahydrofuran or tetrahydropyran, with a low molecular weight diol, for example ethylene glycol, diethylene glycol, triethylene glycol, 1,2-propylene glycol, 1,3-butanediol, 1,4-butanediol, 1,6-hexanediol, dipropylene glycol, tripropylene glycol or neopentyl glycol as an initiator. Among these polyoxyalkylenepolyols, preference is given to those compounds whose alkylene group contains 2 to 7 carbon atoms and more preferably 3 to 6 carbon atoms.

Suitable polyisocyanates include aromatic diisocyanates, aromatic-aliphatic diisocyanates, aliphatic diisocyanates, alicyclic diisocyanates and derivatives or modifications thereof.

Examples of aromatic diisocyanates include m-phenylene diisocyanate, p-phenylene diisocyanate, 4,4'-diphenylene diisocyanate, 1,5-naphthalene diisocyanate, 4,4'-diphenylmethane diisocyanate, 2,4- or 2,6-toluene diisocyanate, 4,4'-toluidine diisocyanate or 4,4'-diphenyl ether diisocyanate.

Examples of aromatic-aliphatic diisocyanates include 1,3- or 1,4-xylene diisocyanates and mixtures of these components.

Examples of suitable aliphatic diisocyanates include trimethylene diisocyanate, tetramethylene diisocyanate, hexamethylene diisocyanate, pentamethylene diisocyanate, 1,2-propylene diisocyanate, 1,2-butylene diisocyanate, 2,3-butylene diisocyanate, 1,3-butylene diisocyanate, 2,4,4- or 2,2,4-trimethylhexamethylene diisocyanate or 2,6-diisocyanatomethyl caproate.

Examples of alicyclic diisocyanates include 1,3-cyclopentane diisocyanate, 1,3-cyclohexane diisocyanate, 1,4-cyclohexane diisocyanate, 3-isocyanatomethyl-3,5,5-trimethylcyclohexyl isocyanate (isophorone diisocyanate), 4,4'-methylenebis(cyclohexyl isocyanate), methyl 2,4-cyclohexane diisocyanate, methyl 2,6-cyclohexane diisocyanate, 1,4-bis(isocyanatomethyl)cyclohexane, 1,3-bis(isocyanato-methyl)cyclohexane or 2,5- or 2,6-bis(isocyanato-methyl)bicyclo[2.2.1]heptane.

Examples of derivatives of polyisocyanates are dimers, trimers, biuret compounds, allophanates, carbodiimides and urea compounds of the abovementioned polyisocyanates.

Examples of modifications of polyisocyanates are isocyanate-terminated oligomeric or polymeric compounds which form from the abovementioned polyols and a stoichiometric excess of the abovementioned polyisocyanates or derivatives thereof. These modified polyisocyanates can be used either alone or in combination with further polyisocyanates.

The basic preparation of polyurethanes is prior art and is described, for example, in G. Oertel, "Polyurethane Handbook", 2nd edition, Carl Hanser Verlag, 1994.

Typically, in the preparation of polyurethanes, prepolymers with terminal isocyanate groups are first synthesized by reaction of polyols with a stoichiometric excess of polyisocyanate (optionally with addition of catalysts), said prepolymers being chain-extended in a subsequent step with further polyol, or mono-, di-, tri- or higher-functionality amines.

To improve the compatibility with water and hence the dispersibility, ionic groups are often incorporated into the polyurethane, for example anionic groups such as carboxylates, sulfonates or sulfuric monoesters, or cationic groups such as quaternary ammonium groups. Among these functional groups, anionic groups and especially carboxyl groups and sulfonic acid groups are preferred.

Ionic groups can be introduced into the polyurethane here through selection of appropriately modified reactants to prepare the prepolymer or of appropriately modified chain extenders. Typical chain extenders with carboxyl functionality are, for example, dimethylolpropionic acid, dimethylolbutyric acid, dimethylolvaleric acid or bis(ethylene glycol) trimellitate. Further chain extenders with a carboxyl function which can be used are, for example, glycine, beta-alanine, 6-aminocaproic acid, 4-aminobenzoic acid, 3,4-diaminobenzoic acid or lysine. Diolsulfonic acids, amino- or diaminosulfonic acids (e.g. sulfanilic acid, naphthyl-aminosulfonic acid, 4,4'-diaminodiphenyldisulfonic acid, 2,2'- or 4,4'-diaminodiphenyl ether 2-sulfonic acid) as chain extenders lead, in contrast, to polyurethanes with sulfonate functionalities.

The anionic groups in the finished polyurethane dispersion are preferably present in the form of their salts, which form through neutralization with a base as early as during the preparation of the prepolymer and/or during the preparation of the aqueous dispersion from the chain-extended polyurethane. For neutralization, it is possible to use either organic bases (e.g. triethylamine, triethylammonium hydroxide) or inorganic bases (e.g. ammonium hydroxide, sodium hydroxide, potassium hydroxide. Preference is given to using inorganic bases and especially ammonium hydroxide for neutralization.

The chain extension typically leads to a significant rise in viscosity, such that the polyurethanes which form are barely dispersible in water. Among other methods, there are 2 common methods for avoiding this problem:

a) The prepolymer is dispersed in water and chain extenders under high shear forces, and the chain extension takes place in the aqueous phase, but in the dispersed particles. To lower the viscosity of the prepolymer, either elevated temperature is employed or organic solvents are added (e.g. N-methylpyrrolidone, dimethylacetamide, butyl-diglycol), which, however, remain in the finished dispersion.

b) The entire polyurethane is synthesized in a water-miscible low-boiling organic solvent (e.g. acetone). The solution is dispersed in water and the solvent is then removed by distillation. The advantage of this method is that the polyurethane which forms is solvent-free, but the preparation costs are higher than in method a).

For the preparation of the inventive coating formulation, preference is given to aqueous polyurethane dispersions prepared from aliphatic polyoxyalkylenepolyols or aliphatic polycarbonatepolyols and polyisocyanates.

A crosslinker used for the inventive coating is at least one water-miscible or water-dispersible component which bears reactive groups which can enter into crosslinking reactions, for example polymers with oxazoline groups, carbodiimide groups, epoxy groups, isocyanate groups or melamine. Among these, especially polymers with oxazoline or carbodiimide groups are preferred.

Polymers containing oxazoline groups are macromolecular compounds which form through addition polymerization of a) oxazoline derivatives according to the structural formulae (I) to (III) and
b) at least one further comonomer.

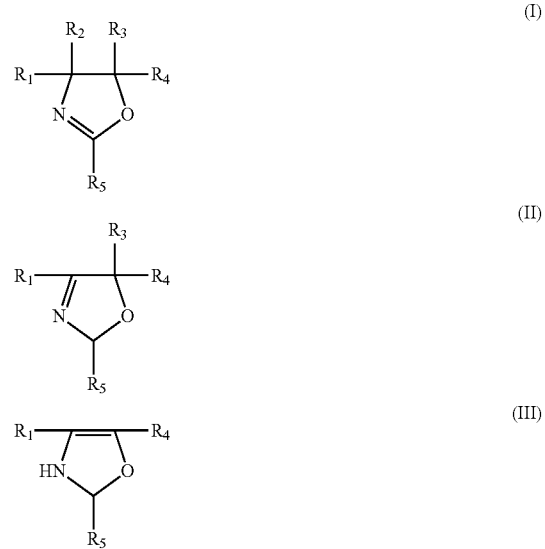

In the structural formulae (I) to (III) depicted above, the $R_1$, $R_2$, $R_3$ and $R_4$ radicals may each independently represent hydrogen atoms, halogen atoms, alkyl groups, aralkyl groups, phenyl groups or substituted phenyl groups. $R_5$ is a noncyclic radical which contains a polymerizable double bond.

Examples of halogen atoms are fluorine, chlorine, bromine and iodine, preference being given to chlorine and bromine. Examples of alkyl groups are methyl, ethyl, n-propyl, isopropyl, n-butyl, isobutyl, pentyl and hexyl groups. Aralkyl groups are understood to mean those radicals which contain alkyl groups with a chain length of 1 to 5 carbon atoms, for example benzyl, phenethyl, benzhydryl and naphthylmethyl groups. Substituted phenyl groups may, for example, be chlorophenyl, bromophenyl, methoxyphenyl, ethoxyphenyl, methylaminophenyl, ethylaminophenyl, dimethylaminophenyl, methylethylaminophenyl and diethylaminophenyl.

Examples of noncyclic radicals with polymerizable double bonds are vinyl and isopropenyl groups.

Examples of oxazoline derivatives a) include 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline and 2-isopropenyl-5-ethyl-2-oxazoline. To prepare polymers bearing oxazoline groups, it is possible to use the oxazoline derivatives a) either individually or in a combination of two or more of the compounds mentioned. Among the oxazoline derivatives mentioned, 2-isopropenyl-2-oxazoline is particularly preferred.

The comonomers b) used may in principle be all compounds which are copolymerizable with oxazoline derivatives a). Examples of comonomers b) are methacrylic esters such as methyl methacrylate, butyl methacrylate and 2-ethylhexyl methacrylate, unsaturated carboxylic acids such as methacrylic acid, itaconic acid and malonic acid, unsaturated nitriles such as methacrylonitrile, unsaturated amides such as methacrylamide and N-methylolmethacrylamide, vinyl esters such as vinyl acetate and vinyl propionate, vinyl ethers such as methyl vinyl ether, ethyl vinyl ether, alpha-olefins such as ethene, propene, halogenated alpha,beta-unsaturated compounds such as vinyl chloride, vinylidene chloride and vinyl fluoride, and also alpha,beta-unsaturated aromatic compounds such as styrene and alpha-methylstyrene. The comonomers b) mentioned may be used either individually or in a combination of 2 or more compounds.

The polymer containing oxazoline groups can be prepared, for example, by adding an oxazoline derivative a), at least one comonomer b) and a free-radical initiator, for example benzoyl peroxide or azoisobutyronitrile, to a suitable water-miscible organic solvent and heating the resulting solution. After the polymerization has ended, water can be added and the organic solvent can be removed completely or partially by distillation, which leaves an aqueous polymer dispersion containing oxazoline groups, which is directly suitable for preparation of the inventive coating solution.

Alternatively, it is also possible to polymerize oxazoline derivative(s) a) and comonomer(s) b) anionically, for example with n-butyllithium.

The content of oxazoline groups in the dried polymer is typically 0.5 to 10 mmol/g, preferably 1.5 to 8 mmol/g. The glass transition temperature of the dried polymer is in the range between 0 and 100° C., preferably 20 to 95° C.

Suitable aqueous polymer dispersions containing oxazoline groups are commercially available under the name "EPOCROS®" from Nippon Shokubai (Japan). In this context, water-soluble, solvent-free products of the "EPOCROS®WS" series from the abovementioned manufacturer are particularly suitable for the inventive coating solution.

Polymers containing carbodiimide groups are macromolecular compounds which bear at least two carbodiimide groups per molecule and which can be prepared by polycondensation of diisocyanates in the presence of catalysts. Corresponding processes are prior art and are described, inter alia, in EP-A-0 878 496 (whose United States equivalent is U.S. Pat. No. 6,124,398). Suitable starting materials for preparing polymers containing carbodiimide groups are aromatic, aliphatic and alicyclic diisocyanates, for example toluene diisocyanate, xylene diisocyanate, diphenylmethane diisocyanate, hexamethylene diisocyanate, cyclohexane diisocyanate, isophorone diisocyanate and dicyclohexyl diisocyanate. Polymers containing carbodiimide groups may also contain surfactants, polyalkylene oxides or hydrophilic monomers, for example quaternary ammonium salts, dialkylamino alcohols and hydroxyalkylsulfonic acid, in order to improve the solubility or dispersibility.

Polymers containing epoxy groups are, for example, bisphenol-epichlorohydrin-based polymers, cycloaliphatic polymeric epoxides, epoxy compounds based on Novolac, epoxy-olefin polymers, epoxy compounds based on polyolglycidyl compounds and epoxysilane polymers. Especially suitable are polyethylene glycol diglycidyl ether, polypropylene glycol diglycidyl ether, neopentyl glycol diglycidyl ether, 1,6-hexaneglycol diglycidyl ether, glyerol polyglycidyl ether, trimethylolpropane polyglycidyl ether, sorbitol polyglycidyl ether and bisphenol A diglycidyl ether.

Polymers containing isocyanate groups are polyisocyanates, for example 2,4-toluene diisocyanate, 2,6-toluene diisocyanate, m-phenylene diisocyanate, p-phenylene diisocyanate, 4,4'-diphenylmethane diisocyanate, 2,4'-diphenylmethane diisocyanate, 2,2'-diphenylmethane diisocyanate, 3,3'-dimethyl-4,4'-biphenylene diisocyanate, 3,3'-dimethoxy-4,4'-biphenylene diisocyanate, 3,3'-dichloro-4,4'-biphenylene diisocyanate, 1,5-naphthalene diisocyanate, 1,5-tetrahydronaphthalene diisocyanate, tetramethylene diisocyanate, 1,6-hexamethylene diisocyanate, dodecamethylene diisocyanate, trimethylhexamethylene diisocyanate, 1,3-cyclohexylene diisocyanate, 1,4-cyclohexylene diisocyanate, xylene diisocyanate, tetramethylxylylene diisocyanate, hydrogenated xylene diisocyanate, lysine diisocyanate, isophorone diisocyanate, 4,4'-dicyclohexyl diisocyanate, 3,3-dimethyl-4,4'-dicyclohexylmethane diisocyanate, tetramethylxylene diisocyanate, and polymers with isocyanate end groups from the reaction of the abovementioned compounds with a trifunctional polyisocyanate of the isocyanurate or biuret type, or a dihydric or higher polyhydric polyol.

Melamine is understood to mean compounds which can be prepared by the reaction of methylolmelamine derivatives, obtainable by condensation of melamine and formaldehyde with lower alcohols, for example methanol, ethanol and isopropanol (or mixtures of these alcohols). Examples of methylolmelamine derivatives are monomethylolmelamine, dimethylolmelamine, trimethylolmelamine, tetramethylolmelamine, pentamethylolmelamine and hexamethylolmelamine.

The inventive coating composition may optionally contain organic solvents in a concentration of less than 10% by weight, preferably less than 5% by weight.

For further improvement of the properties, the coating composition may comprise additional polymers which are preferably added in the form of an aqueous solution or dispersion. The concentration of these polymers in the finished coating composition is less than 50% by weight and preferably less than 30% by weight. Suitable polymers are, for example, polyesters, acrylates, methacrylates, polyvinylpyrrolidone or condensation products of alkoxysilanes.

Optionally, the coating may comprise antiblocking agents. Customary antiblocking agents are inorganic and/or organic particles, for example silicon dioxide, calcium carbonate, aluminum oxide, aluminum silicates, kaolin or crosslinked polystyrene or acrylate particles. Preference is given to porous silicon dioxide such as amorphous silica.

The coating formulation may further comprise further additives, for example surfactants, antistats, antioxidants and/or foam regulators.

The coating composition thus consists preferably only of water and the polyurethane and crosslinker components. "Consists" means here that the composition consists of the aforementioned substances to an extent of at least 50% by weight, preferably at least 65% by weight and more preferably at least 75% by weight.

After the coating process, the coating consists of the dried residue (drying product) of the coating composition, which then equally preferably consists only of the drying product of the polyurethane and crosslinker components, and optionally antiblocking agents, further polymers and/or additives.

In a particularly excellent embodiment, the inventive dried coating consists merely of the reaction product of a polyurethane and of a polymer containing oxazoline groups.

The coating can be applied to one or both sides of the polyester film. However, it is also possible to provide only one side of the film with the inventive coating and to apply another coating on the opposite side.

The inventive coating formulation can be used in order to coat oriented polyester film inline. "Inline" means that the coating is applied during the film production process before the longitudinal and/or transverse stretching.

Optionally, the film can be corona-treated before the coating in order to improve the wetting of the film with the aqueous coating dispersion.

The coating can be applied with a common suitable process, such as with a slot caster or a spraying process. Particular preference is given to the application of the coating by means of the "reverse gravure roll coating" process, in which the coating can be applied extremely homogeneously. Likewise preferred is application by the Meyer rod process, with which greater coating thicknesses can be achieved in a simpler manner.

The dried coating on the finished film has a thickness of 5 to 500 nm, preferably 10 to 250 nm.

The coating components can react with one another and/or with the polyester of the film surface and/or diffuse into the structure of the polyester film surface during the drying and stretching of the polyester film and particularly in the course of the subsequent heat treatment which may reach up to 250° C.

The coating affords, especially on biaxially oriented polyester films, very good lasting adhesion properties to EVA, even at relatively high temperature and in the presence of moisture.

It was extremely surprising that the inventive coatings described, composed of at least one polyurethane and a crosslinker, had excellent adhesion properties both to standard cure and to fast cure EVA types over long periods, even at relatively high temperature and in the presence of moisture. Moreover, it was more than surprising that especially those coatings whose hardness measured by means of nanoindentation was particularly high likewise exhibit particularly good maintenance of the adhesion properties to EVA at relatively high temperature and in the presence of moisture.

Description of the Inventive White Nontransparent Base Film

The polyester film to which the coating is applied may have a one-layer structure, a two-layer structure composed of a base layer (B) and a top layer (A), or a three-layer structure composed of a base layer (B) and two top layers (A' and C). In the case of a multilayer structure of the polyester film, the thickness of the top layer(s) (A, A' and C) is in the range from 0.1 to 10 μm, preferably 0.2 to 5 μm. The thickness of the base layer is calculated correspondingly from the difference of total thickness of the film and the thickness of the top layers applied.

The total thickness of the polyester film is typically within the range from 5 to 750 μm, preferably from 10 to 500 μm.

The inventive film comprises, as the main constituent, a thermoplastic polyester. Such polyesters are specified in the "Handbook of Thermoplastic Polyesters, Ed. S. Fakirov, Wiley-VCH, 2002". Examples are polyesters of ethylene glycol and terephthalic acid (polyethylene terephthalate, PET), of ethylene glycol and naphthalene-2,6-dicarboxylic acid (polyethylene 2,6-naphthalate, PEN) and of 1,4-bis(hydroxymethyl)-cyclohexane and terephthalic acid (poly(1,4-cyclo-hexanedimethylene terephthalate), PCDT). According to the invention, polyesters are understood to mean homopolyesters, copolyesters, blends of different polyesters, regrind and other variations of polyesters.

To achieve the aforementioned properties, especially the low transparency and the desired whiteness of the film, suitable pigments are incorporated into the polyester film. In the case of a multilayer structure, at least the base layer, but possibly also the top layers (A, A' and C), can be modified with pigments. In this context, it has been found to be favorable to use titanium dioxide, calcium carbonate, barium sulfate, zinc sulfide or zinc oxide in a suitable size and suitable concentration. The pigments can be used either alone or in a combination of two or more of the pigments mentioned. Preference is given to using titanium dioxide or barium sulfate or else mixtures of titanium dioxide and barium sulfate.

The titanium dioxide may be either of the rutile type or of the anatase type. The mean particle size of the titanium dioxide is between 0.05 and 0.5 μm, preferably between 0.1 and 0.3 μm. The calcium carbonate has a mean particle size between 0.1 and 2.5 μm, but preference is given to a mean particle size of 0.2 to 2.0 μm. The barium sulfate has a mean particle size of 0.3 to 0.9 μm, preferably from 0.4 to 0.7 μm. By virtue of the pigments incorporated, the film gains a brilliant white appearance. In order to arrive at the desired whiteness (>70) and at the desired low transparency (<40%), the film (in the case of a multilayer structure at least the base layer and possibly also the top layers) must have a high pigment fill level. The particle concentration to achieve the desired low transparency is >=3% by weight but <=50% by weight, preferably >=4% by weight but <=40% by weight and more preferably >=5% by weight but <=30% by weight, based on the total weight of the film.

For a further increase in the whiteness, suitable optical brighteners can optionally be added to the pigmented film (in a multilayer structure preferably to the pigmented layers). Suitable optical brighteners are, for example, HOSTALUX® KS (from Clariant, Germany) or EASTOBRIGHT® OB-1 (from Eastman, USA).

The inventive film may comprise further particles as antiblocking agents in one or more layers. Typical antiblocking agents are inorganic and/or organic particles, for example silicon dioxide (precipitated or fumed), calcium carbonate, magnesium carbonate, barium carbonate, calcium sulfate, lithium phosphate, calcium phosphate, magnesium phosphate, kaolin (hydrated or calcined), aluminum oxide, aluminum silicates, lithium fluoride, calcium salts, barium salts, zinc salts or manganese salts of the dicarboxylic acids used, or crosslinked polymer particles, for example polystyrene or polymethyl methacrylate particles.

In addition, it is also possible to select mixtures of two or more particle systems or mixtures of particle systems with the same chemical composition but different particle size as antiblocking agent.

When particles are present as antiblocking agents in a layer of the film, the total concentration of these particles is less than 20% by weight, based on the total weight of the modified layer, preferably less than 15% by weight and more preferably less than 5% by weight. The particles have a mean size of 0.01 to 15 μm, preferably 0.03 to 10 μm and more preferably 0.05 to 5 μm.

The inventive film may comprise further additives such as UV stabilizers, flame retardants, hydrolysis stabilizers and antioxidants.

UV stabilizers, i.e. UV absorbers as light stabilizers, are chemical compounds which can intervene in the physical and chemical processes of light-induced polymer degradation. Suitable UV stabilizers are, for example, 2-hydroxybenzophenones, 2-hydroxybenzotriazoles, organonickel compounds, salicylic esters, cinnamic ester derivatives, resorcinol monobenzoates, oxanilides, hydroxybenzoic esters, benzoxazinones, sterically hindered amines and triazines, preference being given to the 2-hydroxybenzotriazoles, the benzoxazinones and the triazines. In a very particularly preferred embodiment, the inventive film comprises, as a UV stabilizer, 0.1 to 5.0% by weight of 2-(4,6-diphenyl[1,3,5]triazin-2-yl)-5-hexyloxyphenol of the formula

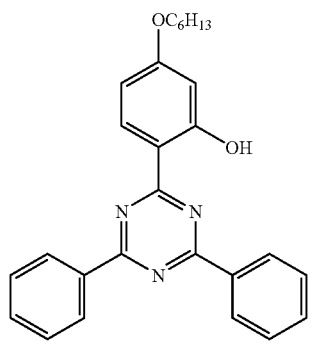

or 0.1 to 5.0% by weight of 2,2'-methylenebis[6-benzo-triazol-2-yl]-4-(1,1,2,2-tetramethylpropyl)phenol of the formula

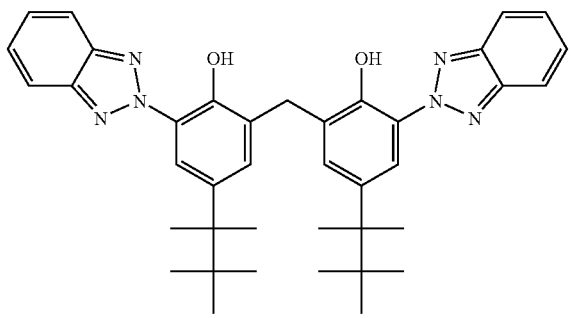 [SMILES: CC(C)(C)C(C)(C)c1cc(Cc2cc(C(C)(C)C(C)(C)C)cc(-n3nc4ccccc4n3)c2O)c(O)c(-n2nc3ccccc3n2)c1]

or 0.1 to 5.0% by weight of 2,2'-(1,4-phenylene)bis([3,1]benzoxazin-4-one) of the formula

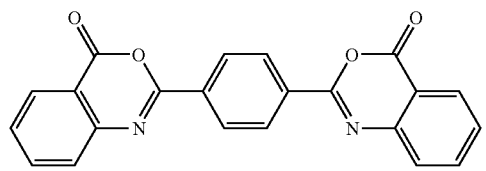 [SMILES: O=c1oc(-c2ccc(-c3nc4ccccc4c(=O)o3)cc2)nc2ccccc12]

In a further embodiment, it is also possible to use mixtures of these UV stabilizers or mixtures of at least one of these UV stabilizers with other UV stabilizers, where the total concentration of light stabilizers is preferably between 0.1 and 5.0% by weight, more preferably in the range from 0.5 to 3.0% by weight, based on the weight of the film.

In a further embodiment, the inventive film has been modified so as to be flame-retardant. Flame-retardant means that the film achieves at least the VTM-2 class in a fire safety test according to UL94 VTM.

Accordingly, the film contains, in one or more layers, a flame retardant in a concentration in the range from 0.2 to 30% by weight, preferably from 1.0 to 20% by weight, based on the total weight of the modified layer. Suitable flame retardants are, for example, organic phosphorus compounds such as carboxyphosphinic acids, anhydrides thereof and dimethyl methanephosphonate. Very suitable in this context are flame retardants in which the phosphorus compound is bonded chemically to the polyester, for example bis(2-hydroxyethyl) [(6-oxido-6H-dibenz[c,e][1,2]oxa-phosphorin-6-yl)methyl]butanedicarboxylate with the formula

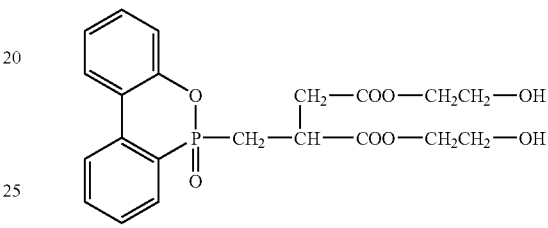

Since the flame retardants generally have a certain hydrolysis sensitivity, the additional use of a hydrolysis stabilizer may be advisable. Suitable hydrolysis stabilizers in this context are, for example, polymereic carbodiimides, for example STABAXOL® P from Rheinchemie (Germany).

The pigments for the achievement of the desired whiteness and the low transparency of the film, antiblocking agents and additives are appropriately added to the polyester used for film production actually before the melting. In this case, the addition can be effected either as a glycolic dispersion during the preparation of the polyester or else via masterbatches in the course of extrusion in the production process of the film.

In addition, the polyester film in the case of a multilayer structure may be sealable or peelable. This is usually achieved through use of polyesters with low glass transition temperature or of other sealable polymers in at least one of the top layers.

The production process for polyester films is described, for example, in "Handbook of Thermoplastic Polyesters, Ed. S. Fakirov, Wiley-VCH, 2002" or in the chapter "Polyesters, Films" in the "Encyclopedia of Polymer Science and Engineering, Vol. 12, John Wiley & Sons, 1988". In the preferred extrusion process for producing the film, the molten polymer material is extruded through a slot die, optionally with the additives, and quenched on a chill roll as a substantially amorphous preliminary film. This film is subsequently reheated and stretched ("oriented") in at least one direction—either in machine direction (MD) or in transverse direction (TD)—but preferably in longitudinal and transverse direction. The film temperatures in the stretching process are generally 10 to 60° C. above the glass transition temperature Tg of the polyester used, the stretching ratio of the longitudinal stretching is typically 2.0 to 6.0, especially 3.0 to 4.5, that of the transverse stretching is 2.0 to 5.0, especially 3.0 to 4.5, and that of any second longitudinal stretching performed is 1.1 to 5.0.

The longitudinal stretching can also be performed simultaneously with the transverse stretching (simultaneous stretching) or in any conceivable sequence. This is followed by heatsetting of the film at oven temperatures of 180 to 260° C., especially of 220 to 250° C. Subsequently, the film is cooled and wound.

It is essential for the inventive base film that the SV of the film after the production process is at least 650, preferably at least 700, in order that the film retains sufficient mechanical stability over a long period when used as a backside cover in solar modules. The SV of the film can be influenced, among other methods, by selection of suitable polyester raw materials with sufficiently high SV and by gentle process conditions which contribute to a low SV degradation (for example low shear stress during extrusion).

It was more than surprising that the combination of the inventive coating with the inventive white nontransparent base film gives rise to polyester films which—either alone or in combination with further materials in the form of laminates—are outstandingly suitable as a backside cover for solar modules.

Table 1 summarizes the most important inventive properties of the coated polyester film once again.

Description of the Test Methods Used

The coated white polyester films were characterized with the following test methods:

Adhesion of the Coating to EVA 2 strips of length 300 mm and width 25 mm are cut out of the coated polyester film. An EVA film strip (thickness 0.5 mm) with a length of 50 mm and a width of 25 mm is placed between the two polyester film strips with the coated sides each facing toward the EVA. Polyester films and EVA are subsequently laminated by means of a heatsealing instrument (TP-701-B, Sangyo Co., Ltd., Japan). Depending on the EVA type used, the following sealing conditions are used:

| EVA Type | Manufacturer | Temp. [° C.] | Pressure [MPa] | Time [min] |
|---|---|---|---|---|
| 485.00 (standard cure) | Etimex, Germany | 150 | 0.13 | 20 |
| 486.00 (fast cure) | Etimex, Germany | 150 | 0.13 | 15 |

To determine the EVA adhesion, strips with a length of 30 cm and a width of 15 mm are first cut out of the 25 mm-wide polyester film/EVA laminates. The unlaminated ends of these 15 mm-wide polyester film strips are clamped into a tensile tester (EZ GRAPH®, Shimadzu, Japan). Subsequently, the force required to separate the polyester film/EVA laminate at an angle of 180° and with a speed of 100 mm/min is measured. What is being assessed here is the average force which occurs in the force/distance diagram.

Thermal and Moisture Stability of the Coating

To determine the long-term stability of the PET/EVA/PET laminates at elevated temperature and humidity, 25 mm-wide test specimens are produced as described above and, based on the standard IEC61215, stored at 85° C., 85% rel. humidity for 1000 h in a climate-controlled cabinet (HIFLEX® FX210C, from Kusumoto Chemicals, Etac Division, Japan).

Subsequently, as described above, 15 mm-wide strips are cut out of the laminates and the averaged separating force is determined. The ratio R of the averaged separating force before and after the treatment in the climate-controlled cabinet is assessed:

$$R = \frac{\text{averaged separating force after 1000 h in the climate-controlled cabinet}}{\text{averaged separation force after 0 h in the climate-controlled cabinet}} \, [\%]$$

R values of >50% suggest excellent thermal and moisture stability of the coating.

Suitability Test for Solar Modules

A glass plate of size 25×25 cm (KRYSTAL KLEAR®, thickness 3 mm, from AFG, USA) is cleaned with isopropanol. Then an EVA film of equal size and the PET film to be tested (with the coated side to the EVA) are placed onto the glass plate. The composite is first introduced into an evacuable heating cabinet with a temperature of 150° C. and the pressure is reduced to 100 mbar (for approx. 2 min). After a further 5 min, the composite is withdrawn and then laminated in a hot press (10t, from Gonno, Japan). Depending on the EVA used, the following conditions are used for this purpose:

| EVA Type | Manufacturer | Temp. [° C.] | Pressure [MPa] | Time [min] |
|---|---|---|---|---|
| 485.00 (standard cure) | Etimex, Germany | 150 | 0.5 | 20 |
| 486.00 (fast cure) | Etimex, Germany | 150 | 0.5 | 15 |

The weathering stability of the glass/EVA/PET laminates is tested according to standard ISO4892 with a WEATHER-O-METER® (C165, from Atlas Material Testing Technology, USA) under the following conditions:

Weathering time: 20 000 h

Intensity: 0.35 W/cm$^2$ at 340 nm (Xenon radiator with borosilicate filter)

Test cycle: 102 min dry phase, 18 min spray phase with deionized water

Black panel temperature: 63° C.

In the course of this, the polyester film is on the side of the laminate facing away from the xenon lamp. The laminate is assessed visually with regard to delamination after the weathering has ended.

Hardness of the Coating

The hardness of the coating is measured by nanoindentation technology. This method enables the hardness of the coating to be determined irrespective of the substrate. A "TS70 TRIBOSCOPE®" nanoindentation device (from Hysitron, USA) is used with a "Berkovich" tip in conjunction with an atomic force microscope (SPM 9500J2, from Shimadzu, Japan). The test is performed at room temperature and 50% rel. air humidity. The penetration depth of the tip is set to 10 nm.

Film Blocking

Two 15 cm×14 cm specimens of film coated on one side are stored in a climate-controlled cabinet at 40° C./80% rel. air humidity for 2 h. Subsequently, the specimens are placed one on top of the other (coated side against uncoated side) and pressed against one another in the climate-controlled cabinet under the abovementioned conditions with a 10 kg weight (corresponding to 48 g/cm$^2$) over a period of 20 h. The specimens are pulled with the aid of a tensile tester (AUTO-GRAPH® AG-1, Shimadzu, Japan) with a speed of 500 mm/min using a taut 0.1 mm-thick steel wire and thus separated from one another. The mean force required in grams is determined from the force-distance diagram. The lower the value, the better is the film blocking behavior of the coated film (values <50 g are excellent).

Coating Quality

The coating quality is assessed visually.

Yellowness Index

The yellowness index of the coated film is determined to ASTM-D 1925-70 by means of a "LAMDA® 12" spectrophotometer from Perkin Elmer (USA), standard illuminant D65, 10° standard observer. The yellowness index is calculated from the normal color values X, Y, Z measured according to the equation $$YID=[100\cdot(1.28\cdot X\cdot 1.06\cdot Z)]/Y$$

Transparency

The transparency is measured to ASTM-D1033-77.

Whiteness

The whiteness is determined according to Berger with the aid of the ELREPHO® electrical reflectance photometer from Zeiss (Germany), standard illuminant C, 2° standard observer. The whiteness is defined as $$W=RY+3RZ-3RX$$

SV (Standard Viscosity)

The standard viscosity SV (DCA), based on DIN 53726, is measured at 25° C. in dichloroacetic acid. The intrinsic viscosity (IV) is calculated from the standard viscosity as follows $$IV=[\eta]=6.907\cdot 10^{-4}\,SV\,(DCE)+0.063096\,[\mathrm{dl/g}]$$

Shrinkage

The shrinkage is measured to DIN4.0634 at 150° C. with residence time 15 min.

Roughness

The arithmetic mean roughness value $R_a$ is determined to DIN 4762 (cutoff 0.25 mm).

Gloss

The gloss is determined to DIN 67530. The reflector value is measured as an optical parameter for the surface of a film. Based on the standards ASTM-D 523-78 and ISO 2813, the angle of incidence is set to 20°. A light beam hits the flat test surface at the angle of incidence set and is reflected or scattered by it. The light rays incident on the photoelectronic receiver are displayed as proportional electrical parameter. The measurement is dimensionless and has to be reported with the angle of incidence.

The invention is illustrated in detail hereinafter with reference to examples. Table 2 lists the coating materials used, and table 3 gives an overview of the examples and comparative examples. The following polyethylene terephthalate raw materials were used for film production:

M80 (Invista, Germany) with an SV of 810 and 18% by weight of barium sulfate (BLANC FIXE® XR-HX, Sachtleben Chemie, Germany)

M67 (Invista, Germany) with an SV of 810 and 7% by weight of titanium dioxide (HOMBITAN® LW-S-U, anatase polymorph, Sachtleben Chemie, Germany)

The results of the characterization of the coated film specimens are summarized in tables 4, 5 and 6.

EXAMPLE 1

Polyester raw material M80 was used to produce a melt which was extruded through a slot die onto a casting roll kept at about 20° C., where it solidified to an amorphous preliminary film. The preliminary film was longitudinally stretched in a stretching ratio of 3.6:1 in the course of which it was kept at a temperature of 95° C. The longitudinally stretched film was subsequently coated by means of a Meyer bar in a thickness of 4.7 μm with an aqueous coating dispersion with a solids content of 5% by weight, which contained 50% by weight of NEOREZ®-600 and 50% by weight of EPOCROS® WS-700 based on the dried coating). The longitudinally stretched and coated film was dried at a temperature of 100° C. and then stretched transversely in a stretching ratio of 4.3:1, so as to obtain a biaxially oriented film. The biaxially stretched film was heatset at 230° C. The final film thickness was 250 μm. The thickness of the dried coating is calculated from the solids content of the coating formulation, the coating thickness (wet) and the transverse stretching factor to 55 nm.

The coated film was characterized by means of the methods described above. It features low transparency, high whiteness, high gloss, very good adhesion to EVA, even under the influence of humidity and heat. Laminates of the film with EVA and glass withstand 20 000 h of artificial weathering without delamination.

EXAMPLE 2

Example 1 was repeated, except that a melt of polyester raw material M67 was used to produce the film. The film was coated and then characterized analogously to example 1. It likewise featured low transparency, high whiteness, high gloss, good adhesion to EVA, even under the influence of humidity and heat. Laminates of the film with EVA and glass withstand 20 000 h of artificial weathering without delamination.

EXAMPLE 3

Example 1 was repeated, except that a melt of 70% by weight of M67 and 30% by weight of M80 was used to produce the film. The film was coated and then characterized analogously to example 1. It likewise featured low transparency, high whiteness, high gloss, good adhesion to EVA, even under the influence of humidity and heat. Laminates of the film with EVA and glass likewise withstand 20 000 h of artificial weathering without delamination.

EXAMPLE 4

The film produced in example 1 was melted at 280° C. The melt was shaped to a strand, quenched in water and processed to pellets. These pellets were added in an amount of 50% by weight to the polyester used to produce the base film. The film was coated and then characterized analogously to example 1. The coated film had similar properties to example 1. The yellowness index of the film was not significantly increased compared to example 1 in spite of use of regrind.

EXAMPLES 6 TO 17

Analogously to example 1, a polyester film was produced and coated as described with 5% by weight coating dispersions whose compositions are specified in table 4. Subsequently, the coated films were characterized by means of the methods described above. They likewise featured low transparency, high whiteness, high gloss, good adhesion to EVA, even under the influence of humidity and heat. Laminates of the film with EVA and glass withstand 20 000 h of artificial weathering without delamination.

COMPARATIVE EXAMPLE 1

Analogously to example 1, a polyester film was produced, but without coating. The uncoated film was characterized by means of the methods described above. The EVA adhesion after 1 000 h at 85° C. and 85% rel. air humidity was inadequate, and laminates of the film with EVA and glass exhibited delamination after 20 000 h of artificial weathering.

COMPARATIVE EXAMPLE 2

Analogously to example 2, a polyester film was produced, but without coating. The uncoated film was characterized by means of the methods described above. The EVA adhesion after 1 000 h at 85° C. and 85% rel. air humidity was inadequate, and laminates of the film with EVA and glass exhibited delamination after 20 000 h of artificial weathering.

COMPARATIVE EXAMPLE 3

The film produced in comparative example 1 was melted at 280° C. The melt was shaped to a strand, quenched in water and processed to pellets. These pellets were added in an amount of 50% by weight to the polyester used to produce the base film. The uncoated film was characterized by means of the methods described above. The EVA adhesion after 1000 h at 85° C. and 85% rel. air humidity was inadequate, and laminates of the film with EVA and glass exhibited delamination after 20 000 h of artificial weathering.

COMPARATIVE EXAMPLES 4 TO 7

Analogously to example 1, a polyester film was produced and coated as described with 5% by weight coating dispersions whose compositions are specified in table 4. Subsequently, the coated films were characterized by means of the methods described above. The EVA adhesion after 1000 h at 85° C. and 85% rel. air humidity was inadequate, and laminates of the film with EVA and glass exhibited delamination after 20 000 h of artificial weathering.

TABLE 1

Overview of the most important inventive properties of the coated film

| Properties | Symbol | Unit | Appropriate | Preferred | Particularly preferred | Test method |
|---|---|---|---|---|---|---|
| Transparency | T | % | <40 | <35 | <30 | ASTM-D1033-77 |
| Whiteness | W | — | >70 | >75 | >80 | Berger |
| Gloss (20°) | GL | — | >5 | >10 | >20 | DIN 67530 |
| Shrinkage (MD/TD) | S | % | <2.5 | <2.0 | <1.5 | in-house |
| Thickness of the film | D | μm | 5 to 750 | 10 to 500 | — | in-house |
| Particle content in the film | — | % by wt. | >=3 to <=50 | >=4 to <=40 | >=5 to <=30 | — |
| Mean roughness | $R_a$ | nm | >30- | >25 | >20 | DIN 4762 |
| SV of the base film | SV | — | >650 | >700 | — | DIN 53726 |
| Thickness of the coating | D | nm | 5 to 500 | 10 to 250 | — | in-house |
| Hardness of the coating | H | GPa | >0.2 | >0.25 | >0.3 | in-house |
| Film blocking | FB | G | >50 | — | — | in-house |
| Adhesion value to EVA | — | N/15 mm | >50 | >70 | — | in-house |
| Adhesion value to EVA after 1000 H @ 85° C., 85% r.h. based on the starting value | R | % | >50 | — | — | in-house |
| Yellowness index with max. 50% of its own regrind | — | — | <80 | <70 | — | ASTM-D 1925-70 |

TABLE 2

Overview of the coating materials used

| Name | Manufacturer | Type |
|---|---|---|
| NEOREZ ® R-600 | DSM Neoresins | aliphatic polyether-polyurethane dispersion |
| NEOREZ ® R-960 | DSM Neoresins | aliphatic polyester-polyurethane dispersion |
| NEOREZ ® R-966 | DSM Neoresins | aliphatic polyether-polyurethane dispersion |
| PERMUTEX ® RU-13-085 | Stahl Europe | aliphatic polycarbonate-polyurethane dispersion |
| EPOCROS ® WS-700 | Nippon Shokubai | water-soluble polymer containing oxazoline groups, 25% in water, Tg: 50° C., 4.5 mmol of oxazoline groups/g of polymer |
| EPOCROS ® WS-300 | Nippon Shokubai | water-soluble polymer containing oxazoline groups, 10% in water, Tg: 90° C., 7.7 mmol of oxazoline groups/g of polymer |
| CARBODILITE ® V-02-L2 | Nisshinbo | water-based polycarbodiimide crosslinker |
| XL-702 | Picassian | water-based polycarbodiimide crosslinker |
| DENACOL ® EX-521 | Nagase Chemical | water-based polyglycerol-polyglycidyl ether crosslinker |
| ELASTRON ® MF-9 | Daiichi Kogyo Seiyaku | water-based dispersion of a protected isocyanate |
| CYMEL ® 385 | Cytec | melamine-formaldehyde dispersion |
| Z-6030 | Dow Corning | methacryloxypropyltrimethoxysilane |
| Z-6040 | Dow Corning | glycidyloxypropyltrimethoxysilane |
| EASTEK ® 1100 | Eastman | aqueous polyester dispersion, Tg: 55° C. |
| PERMUTEX ® RA-22-094 | Stahl Europe | aqueous polyacrylate dispersion, Tg: 35° C. |

TABLE 3

Overview of the examples and comparative examples

| | Base film | | | EVA adhesion coating | | | | |
|---|---|---|---|---|---|---|---|---|
| | Particles [% by wt.] | | Own regrind [% by wt.] | Polyurethane [% by wt.]* | | Crosslinkers [% by wt.]* | | Further components [% by wt.]* |

Examples

| | | | | | | | | | |
|---|---|---|---|---|---|---|---|---|---|
| 1 | BaSO₄ | 18 | — | R-600 | 50 | WS-700 | 50 | — | — |
| 2 | TiO₂ | 7 | — | R-600 | 50 | WS-700 | 50 | — | — |
| 3 | BaSO₄/TiO₂ | 5/5 | — | R-600 | 50 | WS-700 | 50 | — | — |
| 4 | BaSO₄ | 18 | 50 | R-600 | 50 | WS-700 | 50 | — | — |
| 5 | BaSO₄ | 18 | — | R-600 | 25 | WS-700 | 75 | — | — |
| 6 | BaSO₄ | 18 | — | R-600 | 75 | WS-700 | 25 | — | — |
| 7 | BaSO₄ | 18 | — | R966 | 50 | WS-700 | 50 | — | — |
| 8 | BaSO₄ | 18 | — | RU-13-085 | 50 | WS-700 | 50 | — | — |
| 9 | BaSO₄ | 18 | — | R-960 | 50 | WS-700 | 50 | — | — |
| 10 | BaSO₄ | 18 | — | R-600 | 50 | WS-300 | 50 | — | — |
| 11 | BaSO₄ | 18 | — | R-600 | 50 | V-02-L2 | 50 | — | — |
| 12 | BaSO₄ | 18 | — | R-600 | 50 | XL-702 | 50 | — | — |
| 13 | BaSO₄ | 18 | — | R-600 | 50 | EX-521 | 50 | — | — |
| 14 | BaSO₄ | 18 | — | R-600 | 50 | MF-9 | 50 | — | — |
| 15 | BaSO₄ | 18 | — | R-600 | 50 | CYMEL ® 385 | 50 | — | — |
| 16 | BaSO₄ | 18 | — | R-600 | 40 | WS-700 | 40 | Z-6030 | 20 |
| 17 | BaSO₄ | 18 | — | R-600 | 40 | WS-700 | 40 | Z-6040 | 20 |

Comparative Examples

| | | | | | | | | | |
|---|---|---|---|---|---|---|---|---|---|
| 1 | BaSO₄ | 18 | — | — | — | — | — | — | — |
| 2 | TiO₂ | 7 | — | — | — | — | — | — | — |
| 3 | BaSO₄ | 18 | 50 | — | — | — | — | — | — |
| 4 | BaSO₄ | 18 | — | R-600 | 100 | — | — | — | — |
| 5 | BaSO₄ | 18 | — | — | — | WS-700 | 100 | — | — |
| 6 | BaSO₄ | 18 | — | — | — | WS-700 | 50 | 1100 | 50 |
| 7 | BaSO₄ | 18 | — | — | — | WS-700 | 50 | RA-22-094 | 50 |

*% by weight based on the dried coating

TABLE 4

Characterization of the coating and EVA adhesion of the examples and comparative examples

| | | | EVA adhesion at 85° C./85% r.h. | | | | | |
|---|---|---|---|---|---|---|---|---|
| | | | Etimex 485.00 | | | Etimex 486.00 | | |
| | FB [g] | H [GPa] | After 0 h [N/15 mm] | After 1000 h [N/15 mm] | R [%] | After 0 h [N/15 mm] | After 1000 h [N/15 mm] | R [%] |

Examples

| | | | | | | | | |
|---|---|---|---|---|---|---|---|---|
| 1 | 27 | 0.39 | 123 | 117 | 95 | 115 | 109 | 94 |
| 2 | 25 | 0.35 | 135 | 125 | 93 | 111 | 105 | 92 |
| 3 | 24 | 0.35 | 124 | 115 | 93 | 117 | 110 | 93 |
| 4 | 26 | 0.36 | 136 | 124 | 92 | 121 | 106 | 91 |
| 5 | 25 | 0.31 | 131 | 113 | 87 | 118 | 98 | 83 |
| 6 | 35 | 0.32 | 129 | 110 | 85 | 117 | 95 | 81 |
| 7 | 17 | 0.40 | 127 | 122 | 96 | 120 | 114 | 95 |
| 8 | 30 | 0.33 | 115 | 102 | 89 | 107 | 91 | 85 |
| 9 | 19 | 0.31 | 120 | 66 | 55 | 113 | 59 | 52 |
| 10 | 26 | 0.37 | 122 | 115 | 94 | 112 | 105 | 94 |
| 11 | 35 | 0.38 | 129 | 123 | 95 | 115 | 108 | 94 |
| 12 | 41 | 0.35 | 120 | 112 | 93 | 110 | 100 | 91 |

Results of the EVA adhesion of the examples and comparative examples

| | | | EVA adhesion at 85° C./85% r.h. | | | | | |
|---|---|---|---|---|---|---|---|---|
| | | | Etimex 485.00 | | | Etimex 486.00 | | |
| | FB [g] | H [GPa] | After 0 h [N/15 mm] | After 1000 h [N/15 mm] | R [%] | After 0 h [N/15 mm] | After 1000 h [N/15 mm] | R [%] |

Examples

| | | | | | | | | |
|---|---|---|---|---|---|---|---|---|
| 13 | 30 | 0.32 | 114 | 80 | 70 | 105 | 76 | 72 |
| 14 | 32 | 0.31 | 109 | 71 | 65 | 103 | 62 | 60 |

TABLE 4-continued

| | | | | | | | | |
|---|---|---|---|---|---|---|---|---|
| 15 | 27 | 0.32 | 110 | 74 | 67 | 105 | 65 | 62 |
| 16 | 26 | 0.33 | 131 | 107 | 82 | 121 | 98 | 81 |
| 17 | 25 | 0.34 | 129 | 107 | 83 | 119 | 95 | 80 |
| Comparative examples | | | | | | | | |
| 1 | 13 | — | 20 | 2 | 10 | 15 | 2 | 13 |
| 2 | 9 | — | 18 | 1 | 6 | 15 | 1 | 7 |
| 3 | 10 | — | 19 | 1 | 5 | 14 | 1 | 7 |
| 4 | 110 | 0.13 | 71 | 18 | 25 | 58 | 8 | 13 |
| 5 | 57 | 0.11 | 88 | 21 | 24 | 85 | 9 | 10 |
| 6 | 73 | 0.12 | 91 | 20 | 22 | 57 | 13 | 15 |
| 7 | 64 | 0.15 | 93 | 23 | 25 | 88 | 14 | 16 |

TABLE 5

Results of the characterization on the examples and comparative examples

| | T [%] | W [—] | GL [—] | Ra [nm] | SV | S [%] MD | S [%] TD | Coating quality |
|---|---|---|---|---|---|---|---|---|
| Examples | | | | | | | | |
| 1 | 4 | 110 | 47 | 40 | 752 | 1.0 | 0.8 | excellent |
| 2 | 15 | 91 | 50 | 30 | 742 | 1.1 | 0.8 | excellent |
| 3 | 11 | 95 | 51 | 32 | 744 | 1.2 | 0.9 | excellent |
| 4 | 4 | 102 | 59 | 41 | 715 | 1.0 | 0.8 | excellent |
| 5 | 14 | 87 | 62 | 31 | 750 | 1.1 | 0.9 | excellent |
| 6 | 5 | 108 | 46 | 41 | 751 | 1.0 | 0.9 | excellent |
| 7 | 4 | 109 | 46 | 40 | 748 | 1.0 | 0.8 | excellent |
| 8 | 5 | 107 | 46 | 42 | 745 | 1.0 | 0.9 | excellent |
| 9 | 6 | 108 | 47 | 40 | 743 | 1.0 | 0.9 | excellent |
| 10 | 4 | 110 | 45 | 41 | 751 | 1.1 | 0.8 | excellent |
| 11 | 4 | 110 | 49 | 41 | 754 | 1.2 | 0.9 | excellent |
| 12 | 5 | 111 | 50 | 42 | 751 | 1.0 | 0.8 | excellent |
| 13 | 4 | 108 | 47 | 40 | 747 | 1.0 | 0.9 | excellent |
| 14 | 5 | 110 | 47 | 41 | 751 | 1.0 | 0.9 | excellent |
| 15 | 5 | 111 | 48 | 40 | 753 | 1.0 | 0.9 | excellent |
| 16 | 4 | 108 | 47 | 42 | 755 | 1.1 | 0.8 | excellent |
| 17 | 5 | 107 | 46 | 41 | 748 | 1.1 | 0.7 | excellent |
| Comparative examples | | | | | | | | |
| 1 | 5 | 110 | 46 | 42 | 751 | 1.0 | 0.9 | uncoated |
| 2 | 15 | 90 | 52 | 32 | 746 | 1.2 | 0.8 | uncoated |
| 3 | 4 | 104 | 55 | 42 | 717 | 1.1 | 0.8 | uncoated |
| 4 | 6 | 110 | 45 | 41 | 748 | 1.0 | 0.9 | satisfactory |
| 5 | 5 | 110 | 45 | 41 | 750 | 1.0 | 0.8 | good |
| 6 | 5 | 111 | 46 | 42 | 752 | 1.0 | 0.8 | good |
| 7 | 4 | 109 | 47 | 10 | 746 | 1.1 | 0.8 | good |

TABLE 6

Results of the suitability tests for solar modules of the examples and comparative examples

| | State of the laminate after 20 000 h of synthetic weathering | |
|---|---|---|
| | EVA: Etimex 485.00 | EVA: Etimex 486.00 |
| Examples | | |
| 1 to 17 | excellent, no delamination | excellent, no delamination |
| Comparative examples | | |
| 1 | delamination | delamination |
| 2 | delamination | delamination |
| 3 | delamination | delamination |
| 4 | delamination | delamination |
| 5 | delamination | delamination |
| 6 | delamination | delamination |
| 7 | delamination | delamination |

The invention claimed is:

1. A backside cover for solar modules or laminates for backside covers of solar modules comprising white coated polyester film comprising polyester and a coating on at least one of surface of said film, said coating comprising at least one polyurethane and at least one crosslinker, wherein the crosslinker is a polymer comprising an oxazoline group comprising comonomer consisting of one or more of: methacrylic esters, unsaturated carboxylic acids, unsaturated amides, vinyl esters, vinyl ethers, alpha-olefins, or halogenated alpha,beta-unsaturated compounds, wherein said polymer with oxazoline groups has a glass transition temperature from about 20 to 95° C.;

wherein the weight percent of said polymer with oxazoline group is from 25 to 75 and the corresponding weight percent of said polyurethane is from 75 to 25, said polyester film is a biaxially oriented polyester film the dried coating on the polyester film has a thickness of 5 to 500 nm, the polyurethane coated-side of said film is adhered directly to ethylene-vinyl acetate (EVA) such that the polyurethane is in direct contact with said EVA, and said film exhibits an adhesion of the coated surface to EVA, expressed as the force required to separate a laminate composed of the film and EVA, coated side against EVA at an angle of 180°, of >50 N/15 mm.

2. The backside cover for solar modules or laminates for backside covers of solar modules as claimed in claim 1, wherein said film exhibits at least one of the properties listed below:

a transparency of <40%, a Berger whiteness of >70, a gloss of the coated side, measured at a measurement angle of 20°, of >5, a shrinkage at 150° C within 15 min in machine direction and transverse direction of less than 2.5%, an adhesion of the coated sides to EVA, expressed as the force required to separate a laminate composed of the film as claimed in claim 1 and EVA, coated side against EVA at an angle of 180°, of >50 N/15 mm, a long-term stability of the coating to elevated temperature and humidity, expressed as the force required to separate a laminate composed of the film as claimed in claim 1 and EVA, coated side against EVA, after storage at 85° C./85% rel. air humidity for 1000 hours, of still at least 50% of the starting value, a mechanical resistance of the coating, measured by means of nanoindentation, of >0.2 GPa, laminates composed of the film as claimed in claim 1, coated side against EVA, EVA and glass withstand, without delamination, accelerated weathering in a Xenon weathering instrument to ISO4892 over a period of 20 000 h,
an SV of the polyester in the film of more than 700,
a mean roughness $R_3$ of the film on the coated surface of >20,
a yellowness index of less than 80.

3. The backside cover for solar modules or laminates for backside covers of solar modules as claimed in claim 1, wherein the polyurethane was obtained by reacting at least one polyhydroxyl compound with at least one polyisocyanate.

4. The backside cover for solar modules or laminates for backside covers of solar modules as claimed in claim 3, wherein the at least one polyhydroxyl compound is polyesterpolyols, polycarbortate-polyols or polyoxyalkylenepolyols.

5. The backside cover for solar modules or laminates for backside covers of solar modules as claimed in claim 1, wherein the crosslinker is a water-miscible or water-dispersible component comprising reactive groups entering into crosslinking reactions.

6. The backside cover for solar modules or laminates for backside covers of solar modules as claimed in claim 1, wherein the polymer containing oxazoline groups is a macromolecular compound formed through addition polymerization of
a) at least one oxazoline derivative according to one of the structural formulae (I) to (III) and
b) at least one further comonomer,

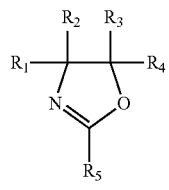
(I)

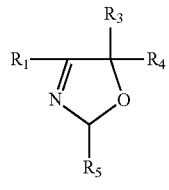
(II)

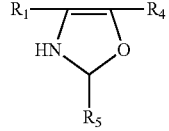
(III)

where the $R_1$, $R_2$, $R_3$ and $R_4$ radicals in the structural formulae (I) to (III) each independently represent hydrogen atoms, halogen atoms, alkyl groups, aralkyl groups, phenyl groups or substituted phenyl groups, and
$R_5$ is a noncyclic radical with a polymerizable double bond.

7. The backside cover for solar modules or laminates for backside covers of solar modules as claimed in claim 6, wherein the comonomer b) consists of one or more of the following compounds: methacrylic esters, unsaturated carboxylic acids, unsaturated nitriles, unsaturated amides, vinyl esters, vinyl ethers, alpha-olefins, halogenated alpha,beta-unsaturated compounds or alpha,beta-unsaturated aromatic compounds.

8. The backside cover for solar modules or laminates for backside covers of solar modules as claimed in claim 1, wherein the coating additionally comprises one or more polymers selected from the group consisting of polyesters, acrylates, methacrylates, polyvinylpyrrolidone and condensation products of alkoxysilanes.

9. The backside cover for solar modules or laminates for backside covers of solar modules as claimed in claim 1 wherein the coating additionally comprises one or more additives selected from the group consisting of antiblocking agents, surfactants, antistats, antioxidants and foam regulators.

10. A solar module comprising a backside cover for solar modules or laminates for backside covers of solar modules as claimed in claim 1 and further comprising ethylene-vinyl acetate in which solar cells are embedded, wherein the polyurethane coated-side of said film is adhered directly to said ethylene-vinyl acetate such that the polyurethane is in direct contact with said EVA.

11. The backside cover for solar modules or laminates for backside covers of solar modules as claimed in claim 2, Wherein said film exhibits at least one of the properties listed below:
a transparency of <35%,
a Berger whiteness of >75,
a gloss of the coated side, measured at a measurement angle of 20° of >10,
a shrinkage at 150° C. within 15 min in machine direction and transverse direction of less than 2.0%,
an adhesion of the coated sides to EVA, expressed as the force required to separate a laminate composed of the film as claimed in claim 2 and EVA, coated side against EVA, at an angle of 180°, of >70 N/15 mm,
a mechanical resistance of the coating, measured by means of nanoindentation, of >0.25 GPa,
an SV of the polyester in the film of more than more than 650,
a mean roughness $R_3$ of the film on the coated surface of >25,
a yellowness index of less than 70.

12. The backside cover for solar modules or laminates for backside covers of solar modules as claimed in claim 2, wherein said film exhibits at least one of the properties listed below:
a transparency of <30%
a Berger whiteness of >80,
a gloss of the coated side, measured at a measurement angle of 20°, of >20,
a shrinkage at 150° C. within 15 min in machine direction and transverse direction of less than 1.5%,
a mechanical resistance of the coating, measured by means of nanoindentation, of >0.3 GPa, and
a mean roughness $R_3$ of the film on the coated surface of >30 nm.

13. The backside cover for solar modules or laminates for backside covers of solar modules comprising as claimed in claim 1, wherein the dried coating on the polyester film has a thickness of 10 to 250 nm.

14. The backside cover for solar modules or laminates for backside covers of solar modules comprising as claimed in claim 1, wherein said polyurethane is derived from polyhydroxyl compounds consisting of one or more of polycarbonatepolyols or polyoxyalkyienepolyols, and said film exhibits an adhesion of the coated sides to EVA, expressed as the force required to separate a laminate composed of the film and EVA, coated side against EVA at an angle of 180°, of >66 N/15 mm after storage at 85° C., 85% relative humidity for 1000 hours.

* * * * *

UNITED STATES PATENT AND TRADEMARK OFFICE
CERTIFICATE OF CORRECTION

PATENT NO. : 9,206,295 B2
APPLICATION NO. : 12/384294
DATED : December 8, 2015
INVENTOR(S) : Thorsten Kiehne and Masato Fujita It is certified that error appears in the above-identified patent and that said Letters Patent is hereby corrected as shown below:

Title page:
Item (73)
Line 2, insert --Mitsubishi Plastics, Inc., Tokyo (JP)--

Claims:
Column 23
Claim 2, Line 7, delete "R3" insert --Ra--

Column 24
Claim 11, Line 42, delete "R3" insert --Ra--
Claim 12, Line 57, delete "R3" insert --Ra--
Claim 14, Line 67, delete "polyoxyalkyienepolyols" insert --polyoxyalkylenepolyols--

Signed and Sealed this
Twelfth Day of July, 2016

Michelle K. Lee
*Director of the United States Patent and Trademark Office*